TRANSISTORIZED SLIDING CLASS A AMPLIFIER

Filed March 7, 1961 2 Sheets-Sheet 1

Inventor
Zbigniew Wiencek
by, Hofgren, Brady, Wegner, Allen & Stellman
Attorneys United States Patent Office 3,166,719
Patented Jan. 19, 1965

3,166,719

TRANSISTORIZED SLIDING CLASS A AMPLIFIER

Zbigniew Wiencek, Rolling Meadows, Ill., assignor to Warwick Electronics Inc., a corporation of Delaware Filed Mar. 7, 1961, Ser. No. 93,917
7 Claims. (Cl. 330—17)

The present invention relates to audio amplifiers and more particularly to a class A audio amplifier having a single output transistor whose low power supply drain and high-power output characteristics are equivalent to push-pull class B amplifiers.

At present, class A audio amplifiers with only a single transistor in their output stage that have an efficiency (low power supply drain with high A.C. output power) approaching that of push-pull class B amplifiers by varying the input bias of this single transistor are generally refered to as sliding class A amplifiers. Their operation depends upon a feedback loop from the output of the output stage for controlling a bias at the input to this stage. This output stage is generally known as the power amplifier stage. In previous sliding class A amplifiers, the power taken from the output of the power amplifier stage for the operation of this control bias causes distortion in the audio output which is generally fed to a speaker.

Push-pull class B amplifier stages have been utilized in the past as the power amplifier stage in many audio amplifiers because they have high efficiency with little distortion. These push-pull stages require two transistors and usually a rather expensive input transformer. If a sliding class A amplifier could be produced which had an equivalent efficiency and equivalent low distortion, the cost of both the input transformer and one transistor would be saved without sacrificing performance. However none of the previous sliding class A amplifiers have been able to achieve full equivalence to the push-pull class B amplifiers.

The power amplifier stage is normally preceded by a driver stage which initially amplifies the detected audio signal. If the feedback of a sliding class A amplifier is utilized to control the bias of the input to the driver stage instead of the input to the power amplifier less distortion is created in the speaker output and less power is required to operate the biasing control.

Both the push-pull class B amplifier and the sliding class A amplifier are particularly desirable for battery operated portable television receivers wherein the high efficiency of these amplifiers extends the life of the batteries. The batteries act as if they are large condensers which prevent the varying power drain of either a push-pull class B or a sliding class A amplifier from varying the voltage to the deflection circuits. If a portable television is to be equipped for operation from both batteries and a 110 volt alternating current source, a problem in the use of either push-pull class B or sliding class A amplifiers arises. When the receiver is operated on 110 volt alternating current, the filter network of the A.C. power supply does not have a sufficiently large capacitance to prevent the varying audio amplifier drain from varying the voltage supplied to the deflection circuits. Therefore the picture continually compresses and expands causing a "flickering" effect as the audio signal increases and decreases. The cost of building a filter network that would eliminate this "flickering" effect is considered to be prohibitive. The present invention eliminates the "flickering" effect by changing a sliding class A amplifier into a conventional class A amplifier whenever the receiver is switched from battery supply to 110 volt alternating current supply.

It is an object of the present invention to provide a sliding class A amplifier whose efficiency is equivalent to push-pull class B amplifiers.

Another object of the present invention is to provide a sliding class A amplifier wherein the feedback loop from the output of the power amplifier stage is utilized to control the input bias of the audio driver stage.

A further object is to provide an improved sliding class A amplifier with less distortion in the output.

An additional object is to provide a new and improved audio amplifier.

Another object is to provide a two stage transistor sliding class A amplifier having a bias control feedback loop connected from the output of the second stage to the first stage for producing a bias voltage on the first stage and on the second stage through the base and collector elements of the first stage.

Still another object is to provide a control feedback loop in accordance with the above object comprising in series a diode and a resistance capacitance network having a time constant just large enough to prevent low frequency audio signal components from feeding back from the output of the second stage to the first stage.

A still further object of the present invention is to provide a class A amplifier in a combination battery and 110 volt alternating current portable television which operates as a conventional class A amplifier when the receiver is operated from the 110 volt power supply and as a sliding class A amplifier whenever the receiver is operated from batteries.

Further objects and advantages will become apparent from the following detailed description taken in connection with the accompanying drawings, in which.

Figure 1:
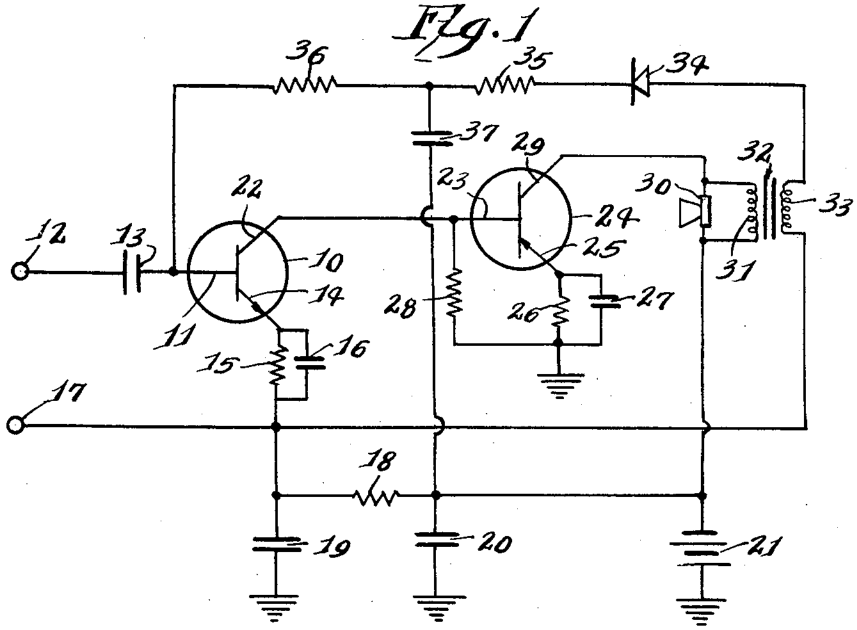
FIGURE 1 is a schematic diagram of an embodiment of the invention.

While this invention is susceptible of embodiments in many different forms, there is shown in the drawings and will herein be described in detail several embodiments of the invention with the understanding that the present disclosure is to be considered as an exemplification of the principles of the invention and is not intended to limit the invention to the embodiments illustrated. The scope of the invention will be pointed out in the appended claims.

In the embodiment of the invention illustrated in FIGURE 1, an amplifying system is shown having a first stage and a second stage, each utilizing transistor amplifying elements. An operating bias or potential for each amplifying stage is obtained from a source as battery 21 through suitable networks, establishing the operating level of the amplifying stages at a point of class A operation low output and correspondingly low battery current drain. The two amplifying stages (driver and power amplifier) are direct current coupled in a cascade arrangement so that the control of the bias of the first amplifying stage causes a corresponding change in the operating bias of the power amplifier stage. A feedback network is connected between the output of the power amplifier stage and the first amplifying stage.

The amplitude of the output signal from the power amplifier stage is used to produce a D.C. voltage which is fed back to control the operating point of the two amplifiers by varying the bias thereon. If this varying bias were not present, the two amplifiers would require a fixed operating point high enough to provide class A operation for the largest input signal expected. Then their efficiency would drop severely for low input signals, and the power supply drain would be constantly at a maximum. With the varying bias in the present invention of both driver and power amplifier stage, a low amplitude input signal requires only a proportionally low power supply drain to preserve maximum efficiency for the entire range of input signals. The efficiency of the present class A amplifier actually slightly exceeds the efficiency of push-pull class B amplifiers for low input signal levels. Thus the present invention is the equivalent of a push-pull class B amplifier both in high efficiency and in low distortion with the advantage that two relatively expensive components have been eliminated.

The circuit of FIGURE 1 will now be described in more detail and specific values and type designations will be assigned to the various circuit elements. It is to be understood that the specific detailed description is given for the purpose of disclosing an operative embodiment of the invention and the various values given are not to be considered critical, unless specifically noted to the contrary.

Referring to FIGURE 1, an NPN junction transistor 10 is utilized as a common emitter amplifier stage. A base 11 of transistor 10 is connected to an input terminal 12 through a 0.5 $\mu$fd. condenser 13. An emitter 14 of transistor 10 is biased by a 470 ohm resistor 15 which has a 50 $\mu$fd. condenser 16 connected in parallel. The other end of resistor 15 is connected to an input terminal 17 and to the output of a power filter network comprised of a 150 ohm resistor 18, a 50 $\mu$fd. condenser 19 and a 50 $\mu$fd. condenser 20. The resistor 18 is connected in series between a negative terminal of a nine volt battery 21 and the resistor 15. Condensers 19 and 20 are connected between opposite ends of resistor 18 and a circuit ground. A positive terminal of battery 21 is also connected to circuit ground. A collector 22 of transistor 10 is connected directly to a base 23 of a PNP junction transistor 24. Transistor 24 is utilized as a common emitter audio power amplification stage. An emitter 25 of transistor 24 is connected to a 27 ohm bias resistor 26 which is connected to circuit ground. A 100 $\mu$fd. condenser 27 is connected in parallel with the resistor 226. A 3300 ohm resistor 28 is connected between the base 23 and circuit ground. A collector 29 is connected to one terminal of a 130 ohm audio speaker 30. The other terminal of the speaker 30 is connected to the negative terminal of the battery 21. A primary coil 31 of a transformer 32 is connected in parallel with the speaker 30. One end of the secondary coil 33 is connected to the emitter 14 of the transistor 10 through the resistor 15. A germanium diode 34, a 4700 ohm resistor 35 and a 47,000 ohm resistor 36 are connected in series between the other end of the secondary coil 33 and the base 11 of the transistor 10. A 1.0 $\mu$fd. condenser 37 is connected between a junction of resistor 36 and resistor 35 and the negative terminal of the battery 21.

Figure 2:
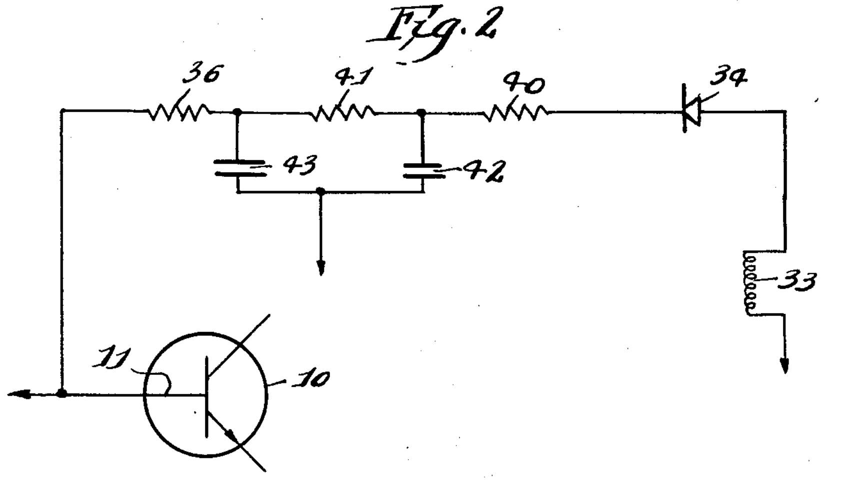
FIGURE 2 is a schematic diagram of a modified embodiment of the invention.

FIGURE 2 shows a modification of the present invention wherein the resistor 35 and the condenser 37 are replaced by a 5600 ohm resistor 40, another 5600 ohm resistor 41, a 1.0 $\mu$fd. condenser 42 and another 1 $\mu$fd. condenser 43. Thus the diode 34, the resistor 40, the resistor 41 and the resistor 36 are in series between the secondary coil 33 and the base 11 of transistor 10. The condenser 42 is connected between a junction of resistor 40 and resistor 41 to circuit ground. Condenser 43 is connected between a junction of resistor 41 and resistor 36 to circuit ground.

Referring again to FIGURE 1 audio signals are placed across the input terminals 12 and 17. These audio signals are amplified in transistor 10 which essentially performs the function of a driver of the audio amplifier described herein. The amplified signals are used to drive the transistor 24 which performs the function of an audio power amplifier. Further amplified audio signals produced by transistor 24 are used to drive the speaker 30. A portion of the output signals from transistor 24 are taken off by the transformer 32. The germanium diode 34 rectifies the audio signals to provide the D.C. bias which is applied to the base 11 of transistor 10. The resistor 36 performs the function of a voltage divider to control the general range of bias voltage to be applied to base 11. The resistor 35 and the condenser 37 form a resistance capacitance network which has a time constant which is just large enough to prevent low frequency audio signal components from feeding back from the output of the transistor 24 into the input of transistor 10 thereby preventing regenerative feedback. However the time constant must be only slightly greater than that required to prevent such regenerative feedback so that the response of the bias to output level is not unduly slow.

The resistor 28 provides a forward bias to transistor 24 whenever there is no audio signal being received by the input terminals 12 and 17. The selection of the values for resistor 28 and for resistor 35 and condenser 37 are somewhat critical and must be selected with care for each design of such an audio amplifier.

A value for resistor 28 can be estimated. Writing the equation for the current flow at the junction of collector 22, base 23 and resistor 28, it is found that:

$$I_{28}+I_{e24}(1-\alpha_{24})-I_{co24}=I_{c10}$$

where:

$I_{28}$ is the current through resistor 28.
$I_{e24}$ is the D.C. emitter current of transistor 24.
$\alpha_{24}$ is the current gain of transistor 24.
$I_{co24}$ is the D.C. collector current of transistor 24 with the emitter 25 open.
$\alpha_{10}$ is the current gain of transistor 10.
$I_{e10}$ is the D.C. collector current of transistor 10.

Writing the voltage equation for the circuit loop comprised of resistor 28, base 23, emitter 25 and resistor 26, it is found that:

$$I_{28}R_{28}-Vbe_{24}-R_{26}I_{e24}=0$$

where:

$I_{28}$ is the current through resistor 28.
$R_{28}$ is the resistance of resistor 28.
$Vbe_{24}$ is the D.C. base emitter voltage of transistor 24.
$R_{26}$ is the resistance of resistor 26.

Combining these two equations to eliminate $I_{28}$ and solving for $R_{28}$:

$$R_{28}=\frac{R_{26}I_{e24}+Vbe_{24}}{I_{c10}+I_{co24}-I_{e24}(1-\alpha_{24})}$$

All currents in the above equation are D.C. currents measured when no A.C. signal is applied. The above equation indicates that $R_{28}$ depends on the base-emitter voltage $Vbe_{24}$. If this voltage is too high, the efficiency of the amplifier is low. If this voltage is too low, large distortions will result. To achieve acceptable efficiency, $Vbe_{24}$ should not be higher than is required to produce a D.C. collector current which is one-third of the D.C. collector current for full power output. At this point there is no longer an advantage to having a sliding class A circuit. Therefore the value of $Vbe_{24}$ must be between this value and zero. By substituting these values in the above formula, the limits of the range of values for resistor 28 may be calculated.

When a low amplitude audio signal is being received at terminals 12 and 17, the transistor 10, and through it, the transistor 24 are biased to low power supply drains. As the amplitude of the input audio signal increases, the bias on transistor 10 rises which also causes the bias on transistor 24 to rise with a proportional increase in power supply drain.

In order to further insure against the possibility of a regenerative feedback being produced by the low frequency audio signals, it has been found desirable to add a second section to the resistance capacitance network in the bias control loop. Such a second section arrangement is shown in the modified embodiment of the bias control loop illustrated in FIGURE 2.

It will be recognized by those well skilled in the art that a PNP transistor may be substituted for the NPN transistor 10 if an NPN transistor is substituted for the PNP transistor 24. The polarity of the bias applied to the base 23 of transistor 24 must be opposite in polarity to the bias applied to base 11 of transistor 10 because the transistor 10 reverses the bias polarity in transmitting the bias produced by the feedback network to transistor 24. Thus transistors 10 and 24 cannot both be of the NPN type nor can they both be of the PNP type.

Figure 3:
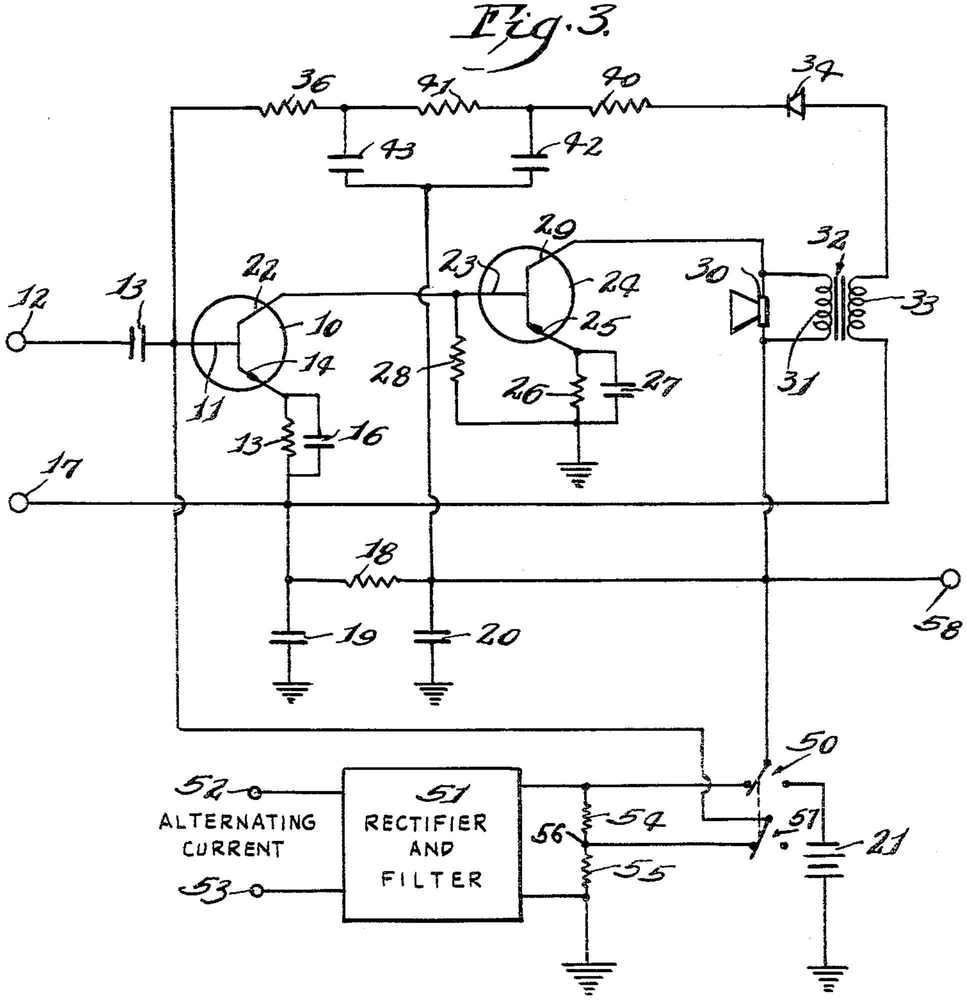
FIGURE 3 is a schematic diagram of a modified embodiment of the invention.

FIGURE 3 shows the circuit of FIGURE 2 selectively connected to either a battery power supply as shown in FIGURE 1 or to a 110 volt A.C. power supply. The elements in FIGURE 3 which correspond to the elements in FIGURES 1 and 2 have the same identification numerals. A switch 50 selects either the battery 21 or the D.C. power supply 51 which has conventional rectifiers and filter circuits. The supply 51 is connected to input terminals 52 and 53 which may be attached across a source of 110 volt A.C. current. A resistor 54 and a resistor 55 are connected across the output of supply 51 to produce a bias voltage at a common junction point 56. This voltage may be applied through a switch 57 to the base 11 of transistor 10. The switch 57 is mechanically connected to switch 50 to provide the bias voltage to base 11 whenever switch 50 is connecting power supply 51 to the circuits of the television receiver. Switch 50 selectively connects either the power supply 51 or the battery 21 to a terminal 58 and to the primary coil 31 and the resistor 18 as does the battery 21 in the embodiments shown in FIGURE 1. The terminal 58 is connected to the other circuits (not shown) of conventional television receivers including the picture tube deflection circuits.

With switch 50 connecting the battery 21 to the receiver circuits the amplifier shown in FIGURE 3 operates as a sliding class A amplifier in the manner previously described. The apparent capacitance of battery 21 prevents the rapid fluctuating of the power drain by the amplifier from varying the voltage to the deflection circuits. Thus the sliding class A operation preserves the life of the batteries without a detrimental effect upon the deflection circuits.

When the switch 50 is positioned to connect the 110 volt power supply 51, the switch 57 connects the bias voltage at junction point 56 to the base 11 to override the bias produced by the feedback circuit so that both transistors operate as conventional class A amplifiers with a constant drain on the power supply 51. If the transistors were allowed to continue to act as sliding class A amplifiers, the varying power drain produced by the sliding operation would cause the voltage to the deflection circuits to vary. The picture on the screen would fluctuate in width and height and appear to "flicker" as does present portable television equipped with push-pull class B amplifiers when they are operated on 110 volt power suppliers. When the 110 volt power supply is connected to the receiver there is no longer a requirement to preserve power drain. Therefore by overriding the sliding bias with a constant bias the "flickering" of the picture is eliminated when the receiver is switched to 110 volt operation and there is no detrimental effect on the power supply. The present invention allows the alternate advantages of constant and sliding class A operations to be utilized when the appropriate alternate power source is connected. The sliding class A amplifier could be in accordance with the single stage feedback loop type instead of the two stage feedback loop type shown in FIGURE 3, but as described previously, the operation of the single stage feedback loop is less desirable.

I claim:

1. A two-stage, sliding class A transistor amplifier, comprising: a driver stage including a transistor of one conductivity type having a base input element and an emitter-collector output circuit; a source of signal connected to said base element; an output stage including a transistor of the opposite conductivity type, having a base input element direct current connected to the output circuit of said driver stage and having an emitter-collector output circuit; and an automatic bias control circuit for both stages of said amplifier including a diode having a generally linear forward current-voltage characteristic and a low pass filter connected in series between the emitter-collector output circuit of said output stage and the base of said driver stage, applying to the base of the driver stage and through the driver to the base of the output transistor, a direct current bias directly proportional to the amplitude of the signal in the output circuit of said output stage.

2. The two-stage sliding class A transistor amplifier of claim 1 wherein said automatic bias control circuit includes a direct current blocking element connected between the output circuit of said output stage and said diode.

3. The two-stage sliding class A amplifier of claim 2 wherein said blocking element is a transformer having primary winding connected in the emitter-collector output circuit of the output stage and a secondary winding connected in series with the diode and low pass filter.

4. A two-stage, sliding class A transistor amplifier, comprising: a driver stage including a transistor of one conductivity type having a base input element and an emitter-collector output circuit and connected in a common emitter configuration; a source of signal connected to said base element; an output stage of the opposite conductivity type, having a base input element and an emitter-collector output circuit, said base element being direct current connected to the collector of said driver stage, the transistor being connected in a common emitter configuration; and means connecting an automatic bias control circuit for both stages of said amplifier, including a diode and a low pass filter, connected in series, between the collector of said output stage and the base of said driver stage, applying to the base of the driver stage and through the driver to the base of the output transistor, a direct current bias directly proportional to the amplitude of the signal in the output circuit of said output stage.

5. A two-stage, sliding class A transistor amplifier, comprising: a source of transistor operating potential; a driver stage including a transistor of one conductivity type having a base input element and an emitter-collector output circuit; a source of signal connected to said base element; an output stage including a transistor of the opposite conductivity type, having a base input element direct current connected to the output circuit of said driver stage and having an emitter-collector output circuit, the emitter-collector output circuit of the driver transistor being connected in series with the base emitter circuit of the output transistor across said source of operating potential; and an automatic bias control circuit for both stages of said amplifier including a diode having a generally linear forward current-voltage characteristic and a low pass filter connected in series between the emitter-collector output circuit of said output stage and the base of said driver stage, applying to the base of the driver stage and through the driver to the base of the output transistor, a direct current bias directly proportional to the amplitude of the signal in the output circuit of said output stage.

6. The two-stage sliding class A transistor amplifier of claim 5 including a battery and a rectifier-filter power supply energizable from an alternating current source and having a double-throw switch selectively connecting the emitter-collector output circuit of both transistors with one or the other of the battery and rectifier-filter power supply, and a fixed bias source and a single-throw switch ganged with said double-throw switch connecting the base of said driver transistor with said fixed bias source when the emitter-collector output circuits of said transistors are connected with said rectifier power supply.

7. The two-stage sliding class A amplifier of claim 6 wherein said fixed bias source is a resistive voltage divider connected with the rectifier power supply.

References Cited in the file of this patent

UNITED STATES PATENTS

| | | |
|---|---|---|
| 2,761,916 | Barton | Sept. 4, 1956 |
| 2,812,393 | Patrick | Nov. 5, 1957 |
| 2,847,519 | Aronson | Aug. 12, 1958 |
| 3,002,109 | Baird | Sept. 26, 1961 |
| 3,075,151 | Murray | Jan. 22, 1963 |

FOREIGN PATENTS

| | | |
|---|---|---|
| 852,059 | Great Britain | Oct. 19, 1960 |